United States Patent
Wang

(10) Patent No.: US 7,208,789 B2
(45) Date of Patent: Apr. 24, 2007

(54) DRAM CELL STRUCTURE WITH BURIED SURROUNDING CAPACITOR AND PROCESS FOR MANUFACTURING THE SAME

(75) Inventor: Ting-Shing Wang, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 11/062,563

(22) Filed: Feb. 23, 2005

(65) Prior Publication Data

US 2005/0139889 A1 Jun. 30, 2005

Related U.S. Application Data

(62) Division of application No. 10/210,031, filed on Aug. 2, 2002, now Pat. No. 6,875,653.

(51) Int. Cl.
*H01L 29/78* (2006.01)
(52) U.S. Cl. ............... 257/296; 257/300; 257/301; 257/516; 257/532; 257/E27.092; 257/E29.346; 438/155; 438/244
(58) Field of Classification Search ............... 257/68, 257/71, 296, 300, 301, 516, 532, E27.092, 257/E27.093, E29.346; 438/155, 244, FOR. 189, 438/FOR. 220
See application file for complete search history.

(56) References Cited

U.S. PATENT DOCUMENTS

| | | | |
|---|---|---|---|
| 4,704,368 A | 11/1987 | Goth et al. | |
| 4,801,989 A * | 1/1989 | Taguchi | 257/305 |
| 4,999,689 A | 3/1991 | Iguchi et al. | |
| 5,223,447 A | 6/1993 | Lee et al. | |
| 5,684,313 A | 11/1997 | Kenney | |
| 5,981,332 A | 11/1999 | Mandelman et al. | |
| 6,090,661 A | 7/2000 | Perng et al. | |
| 6,180,973 B1 * | 1/2001 | Ozaki | 257/305 |
| 2001/0000689 A1 * | 5/2001 | Kajiyama | 365/149 |
| 2002/0127811 A1 * | 9/2002 | Noble | 438/300 |
| 2002/0191455 A1 * | 12/2002 | Richter et al. | 365/200 |

* cited by examiner

*Primary Examiner*—George R. Fourson
*Assistant Examiner*—Joannie Adelle Garcia
(74) *Attorney, Agent, or Firm*—Finnegan, Henderson, Farabow, Garrett & Dunner, L.L.P.

(57) ABSTRACT

A memory device that includes a semiconductor substrate, and an array of memory cells, each cell being electrically isolated from adjacent cells and including an island formed from the substrate, the island having a top portion and at least one sidewall portion, and being spaced apart from other islands by a bottom surface on the substrate, a capacitor formed contiguous with the sidewall portion, and a transistor formed on the top portion of the island, the transistor including a gate oxide layer formed on a surface of the top portion, a gate formed on the gate oxide layer, and a first and a second diffused regions formed in the top portion, the first diffused region being spaced apart from the second diffused region.

13 Claims, 6 Drawing Sheets

DRAM CELL STRUCTURE WITH BURIED SURROUNDING CAPACITOR AND PROCESS FOR MANUFACTURING THE SAME

This application is a division of Application Ser. No. 10/210,031, filed Aug. 2, 2002 now U.S. Pat. No. 6,875,653, the entire contents of which are incorporated herein by reference.

FIELD OF THE INVENTION

This invention pertains in general to semiconductor devices, and, more particularly, to memory cells for a dynamic random access memory (DRAM) and processes for manufacturing the same.

BACKGROUND OF THE INVENTION

In the semiconductor industry, DRAMs are among the most important integrated circuits and the source of continuing research and development. There is a continuing effort to increase their storage capacity, improve writing and reading speed, and decrease device dimensions. A DRAM cell generally includes a transistor and a capacitor operated by the transistor. Conventionally, DRAM cell designs can be divided into three types, namely planar, stacked-capacitor and trench. In the planar design, the transistor and capacitor of a cell are produced as planar components. In the stacked-capacitor design, the capacitor of a cell is disposed above the transistor. In the trench design, the transistor is disposed on the surface of a substrate, and the capacitor is disposed in a trench formed in the substrate.

The process of forming a trench, however, requires an accurate alignment of mask work. For deep sub-micron semiconductor devices, a deep trench may have a length-to-diameter aspect ratio of 40:1. Typically, capacitors are formed in the deep and narrow trenches by depositing a dielectric layer on the trench walls and filling the trench with a doped polysilicon layer. As the aspect ratio becomes higher, for example, exceeds 20:1, the trench becomes more difficult to fill.

SUMMARY OF THE INVENTION

Accordingly, the present invention is directed to DRAM cells that obviate one or more of the problems due to limitations and disadvantages of the related art. The present invention also provides processes for manufacturing the cells.

Additional features and advantages of the invention will be set forth in the description which follows, and in part will be apparent from the description, or may be learned by practice of the invention. The objectives and other advantages of the invention will be realized and attained by the cell structures particularly pointed out in the written description and claims thereof, as well as the appended drawings.

To achieve these and other advantages, and in accordance with the purpose of the invention as embodied and broadly described, there is provided a memory cell that includes a semiconductor substrate, a capacitor and a transistor, in which the substrate includes an island formed from the substrate, the island having a top portion and at least one sidewall portion, the capacitor is formed contiguous with the sidewall portion, and the transistor is formed on the top portion of the island, the transistor including a gate oxide layer formed on a surface of the top portion, a gate formed on the gate oxide layer, and a first and a second diffused regions formed in the top portion, the first diffused region being spaced apart from the second diffused region.

In one aspect of the present invention, the capacitor includes a doped region formed in the sidewall portion, a dielectric layer formed contiguous with the sidewall portion, and a polysilicon layer formed contiguous with the dielectric layer.

In another aspect of the present invention, the memory cell includes a buried strap that couples the first diffused region of the transistor to the second plate of the capacitor.

Also in accordance with the present invention, there is provided a memory device that includes a semiconductor substrate and an array of memory cells, each cell being electrically isolated from adjacent cells and including an island formed from the substrate, a capacitor and a transistor, in which the island has a top portion and at least one sidewall portion, and is spaced apart from other islands by a bottom surface on the substrate, the capacitor is formed contiguous with the sidewall portion and the transistor is formed on the top portion of the island, the transistor including a gate oxide layer formed on a surface of the top portion, a gate formed on the gate oxide layer, and a first and a second diffused regions formed in the top portion, the first diffused region being spaced apart from the second diffused region.

Still in accordance with the present invention, there is provided a process for manufacturing a memory device, the process including defining a semiconductor substrate, etching the substrate to form an array of islands spaced apart from one another by a bottom surface on the substrate, each island having a top portion and at least one sidewall portions, doping the sidewall portion and the bottom surface, forming a dielectric layer contiguous with the sidewall portion, forming a polysilicon layer contiguous with the dielectric layer, electrically isolating the array of islands with an insulating material, forming an oxide layer on a surface of the top portion, forming a gate on the oxide layer, and forming a first diffused region and a second diffused region spaced apart from the first diffused region in the top portion.

In one aspect of the present invention, the process further includes etching the insulating material disposed on the bottom surface in a direction of a bit line to expose the polysilicon layer, depositing a conductor layer on the etched insulating material, and etching the conductor layer to form a first conductor portion and a second conductor portion spaced apart from the first conductor portion, in which the first conductor portion couples the first diffused region to the polysilicon layer.

In another aspect of the present invention, the process further includes etching the insulating material disposed on the bottom surface in the direction of the bit line to expose the second diffused region, and depositing a contact layer on the etched insulating material to couple the second diffused region to the bit line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1A:
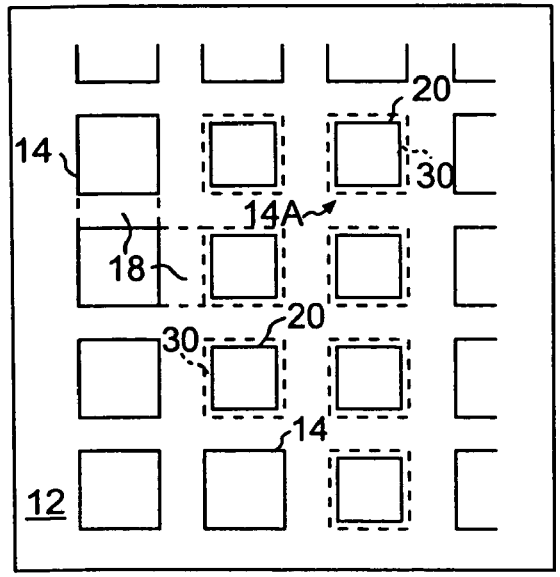
FIG. 1A shows a top view of a memory cell array layout consistent with the present invention.

FIG. 1A shows a top view of a layout of a memory cell array 10 in accordance with the invention. Referring to FIG. 1, the cell array 10 includes a substrate 12 and a plurality of memory cells 14 formed on the substrate 12. A representative cell 14A includes a three-dimensional island 20, a capacitor 30 surrounding the island 20 and a transistor (not shown) formed on the island 20. The island 20 is a part of the substrate 12 and, in the embodiment, has a substantially rectangular cross section. Other embodiments may include islands in the form of a cylinder. In the cell array 10, a trench space 18 is defined as the space between the areas defined by opposing sidewalls of two adjacent memory cells.

Figure 1C:
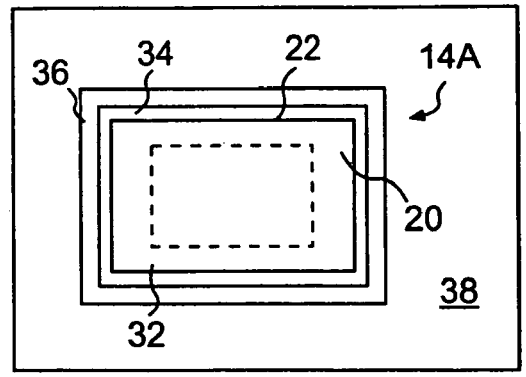
FIG. 1C shows a top view of a single memory cell layout consistent with the present invention.
Figure 1B:
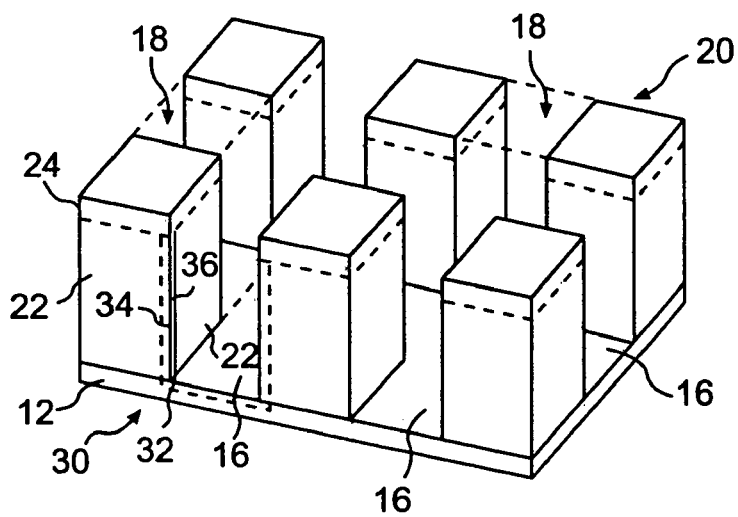
FIG. 1B shows a perspective view of a memory cell array consistent with the present invention.

FIG. 1B shows a perspective view of the cell array 10 prior to the formation of transistors. Referring to FIG. 1B, each island 20 includes four sidewall portions 22 wherein a capacitor 30 is formed and a top portion 24 where a transistor (not shown) will be formed. Each island 20 is spaced apart from adjacent islands by a bottom surface 16 on the substrate 12. The trench space 18 is thus defined between two adjacent islands by their opposing sidewall portions 22 and the bottom surface 16 therebetween.

The capacitor 30 includes a first plate 32 formed within the sidewall portion 22, a dielectric layer 34 formed contiguous with the sidewall portion 22, and a second plate 36 formed contiguous with the dielectric layer 34. In one embodiment of the invention, the first plate 32 is a doped silicon region, the dielectric layer 34 is a nitride oxide layer and the second plate 36 is a polysilicon layer.

FIG. 1C shows a top view of the layout of the representative cell 14A shown in FIG. 1A and, in particular, the first plate 32, the dielectric layer 34 and the second plate 36 of the capacitor 30. In addition, FIG. 1C shows an insulating material 38 filling the trench spaces 18 and remaining spaces among the islands 20 to electrically isolate the cells. In one embodiment, the insulating material 38 is oxide.

Figure 2:
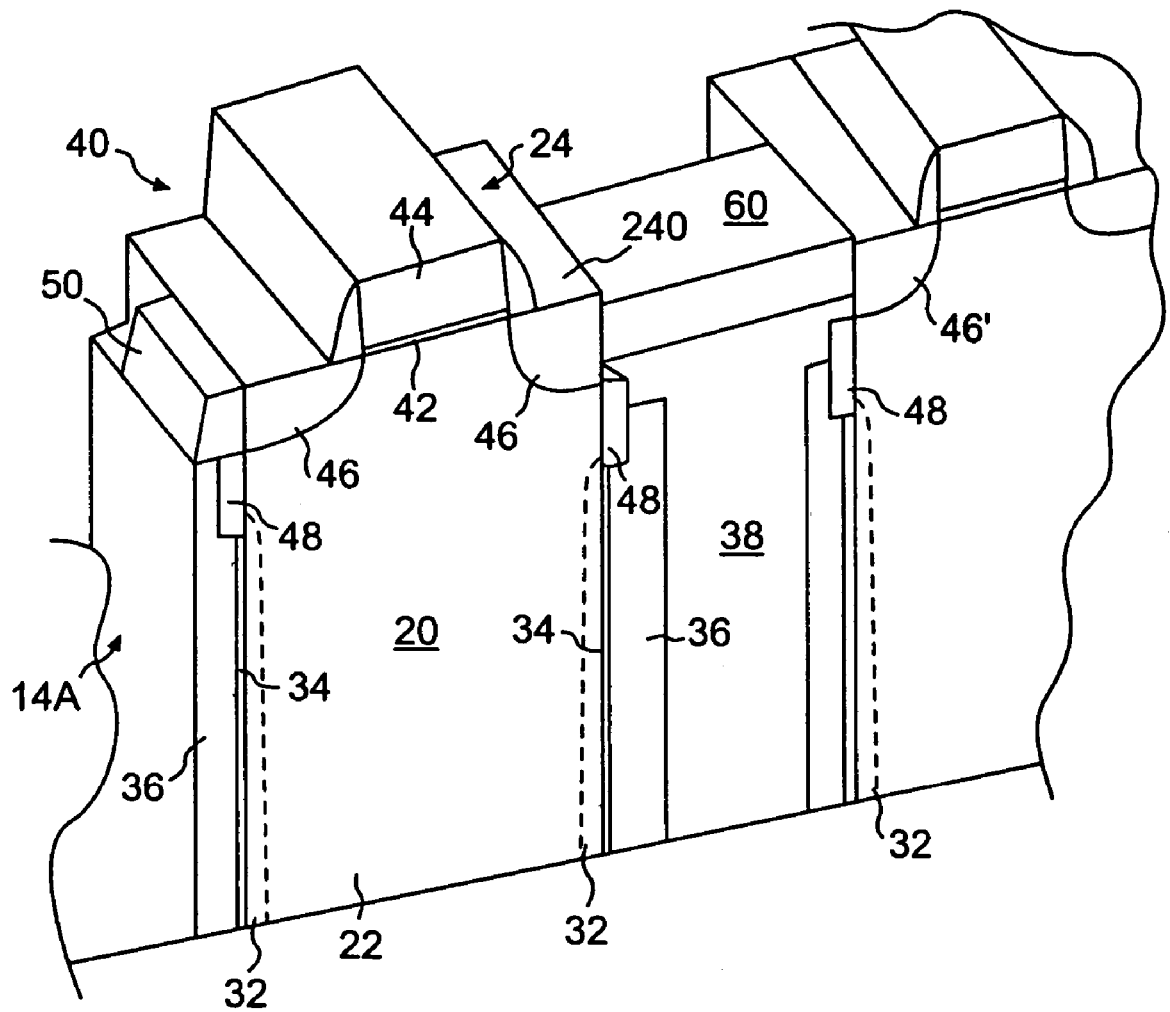
FIG. 2 shows a perspective view of a memory cell consistent with the present invention.

FIG. 2 shows a perspective view of the representative cell 14A shown in FIG. 1A. Referring to FIG. 2, a transistor 40 is formed on the top portion 24 of the island 20 and includes a gate oxide layer 42 disposed on a top surface 240 of the top portion 24, a gate 44 formed on the gate oxide layer 42, and a pair of spaced-apart diffused regions 46 formed in the top portion 24. The gate 44 is coupled to a word line (not shown). The diffused regions 46 serve as a source/drain pair for the transistor 40, and one of the diffused regions 46 is coupled to a bit line (not shown).

A collar oxide layer 48 may be disposed on the upper part of the sidewall portion 22 and contiguous with the dielectric layer 34 and the second plate 36 to reduce parasitic leakage at the sidewall portion 22. A buried strap 50 couplestone of the diffused regions 46 of the transistor 40 to the second plate 36 of the capacitor 30. The buried strap 50 provides a path for the transistor 40 to read from or write into the second plate 36 of the capacitor 30. A bit line contact layer 60 is disposed between two adjacent cells and adjoins the opposing diffused regions 46 and 46' of the adjacent cells. The bit line contact layer 60 couples the opposing diffused regions 46 and 46' to a bit line.

Figure 3:
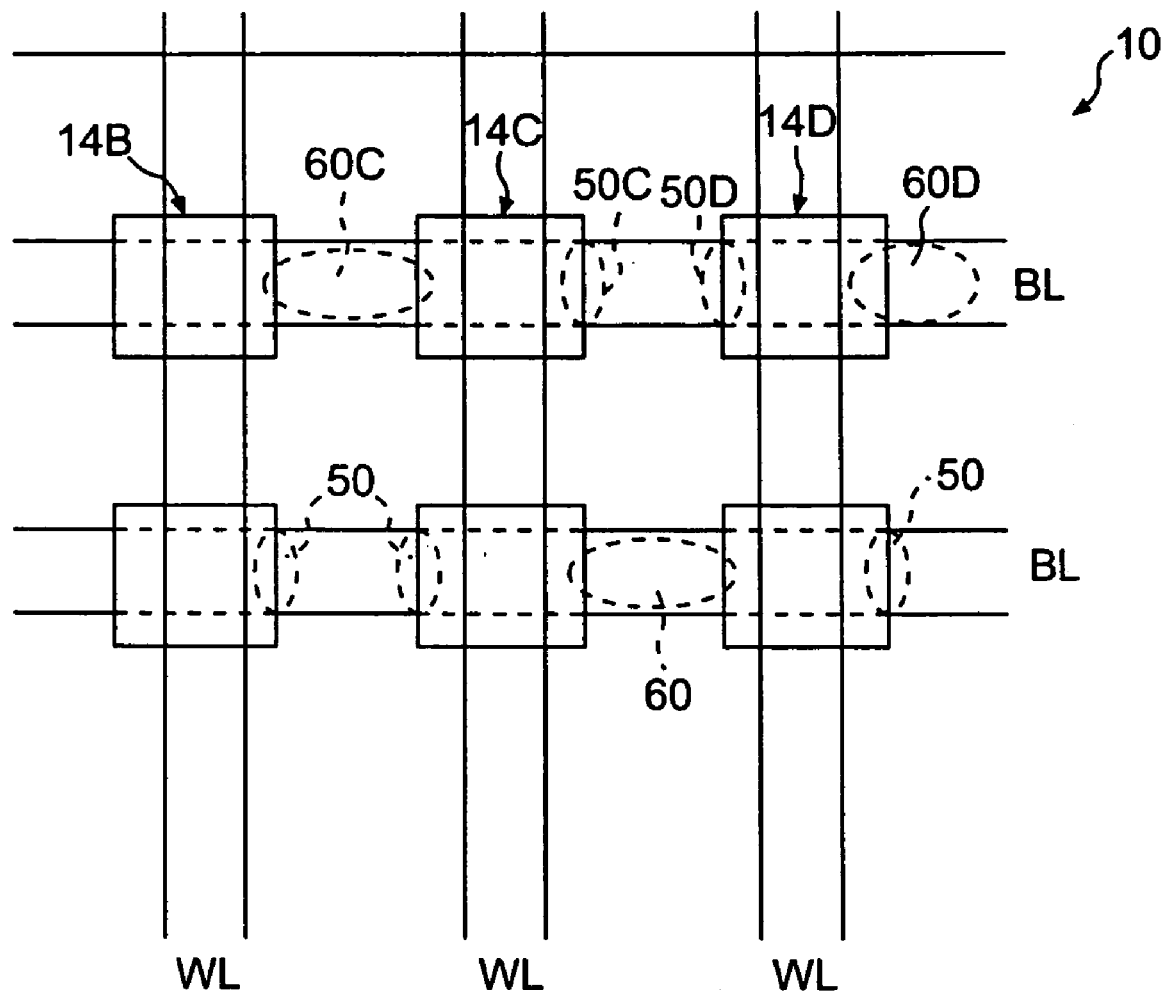
FIG. 3 shows a top view of the layout of buried straps and bit contacts in a cell array.

FIG. 3 shows a top view of the layout of buried straps 50 and bit line contacts 60 in the cell array 10. Referring to FIG. 3, as an example of the cell 14C, in a bit line (BL) direction, one of the diffused regions (not shown) of the cell 14C is coupled to a buried strap 50C, and the other diffused region is coupled to a bit line contact 60C. The buried strap 50C of the cell 14C is spaced laterally from the buried strap 50D of an adjacent cell 14D, and the bit line contact 60C is shared by a cell 14B and the cell 14C. The gate (not shown) of the cell 14C is coupled to a word line (WL).

Figure 4:
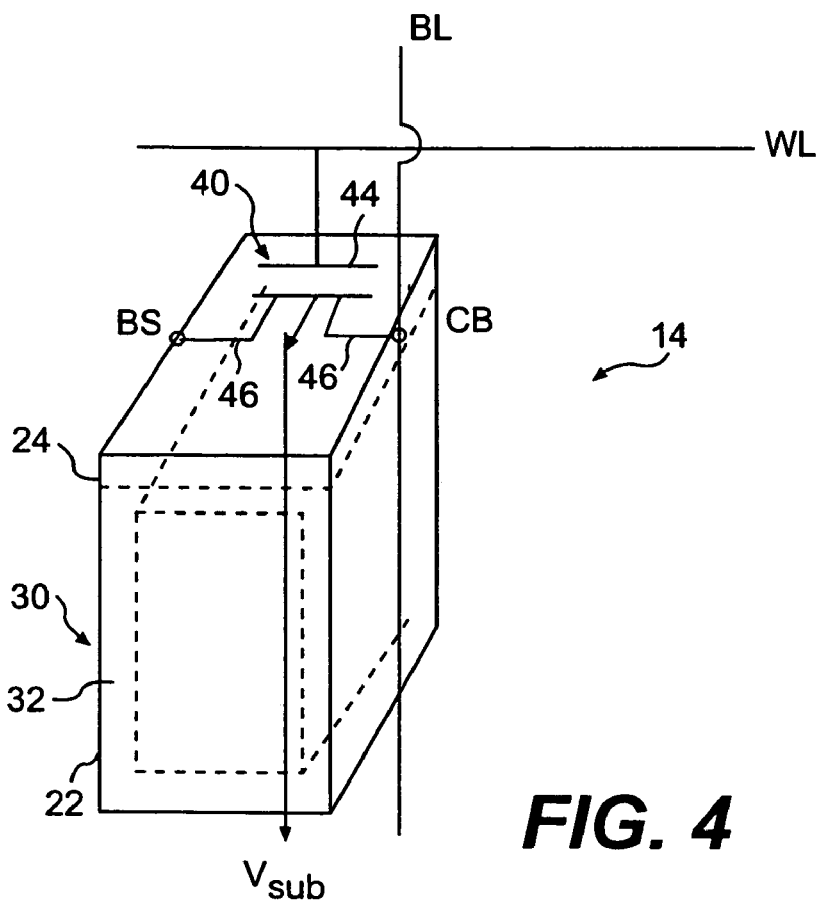
FIG. 4 is a schematic of a memory cell consistent with the invention.

FIG. 4 shows a schematic view of a single cell 14. The gate 44 of the transistor 40 on the top portion 24 is coupled to a word line (WL). One diffused region 46 of the transistor 40 is coupled to a contact layer (CB) and in turn to a bit line (BL). The other diffused region 46 of the transistor 40 is coupled to the second plate 36 (not shown in FIG. 4) of the capacitor 30 by a buried strap (BS). The first plate 32 of the capacitor 30 is coupled to the substrate 12, or a reference voltage Vsub.

Figure 5A:
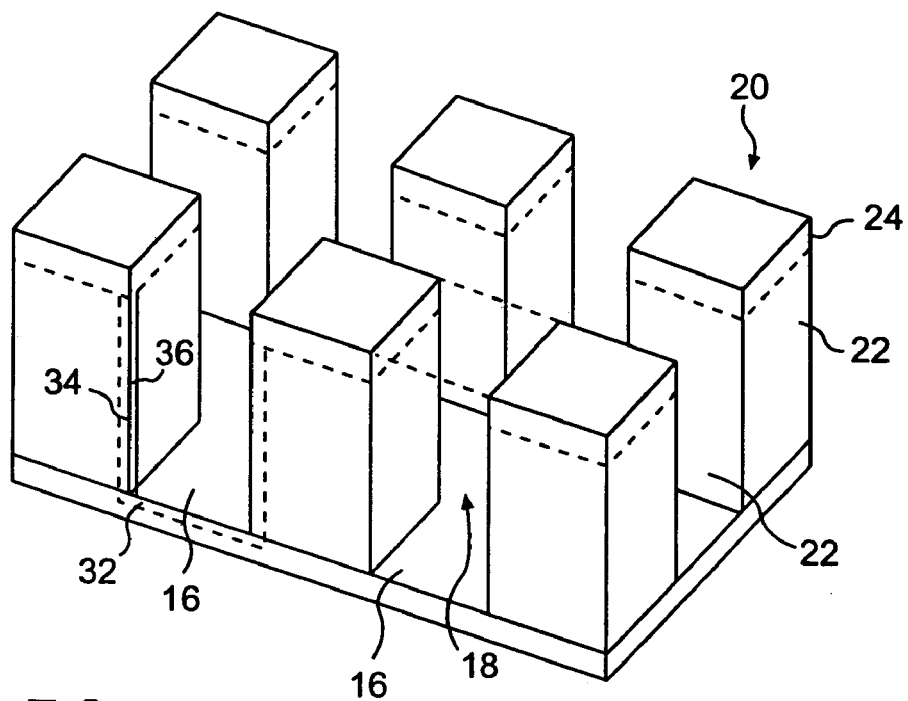
FIGS. 5A to 5E show the process for manufacturing a memory cell array consistent with the invention.

FIGS. 5A to 5E show the process for manufacturing a memory cell array 10 in accordance with the invention. Referring to FIG. 5A, the process begins with preparing a substrate 12, which may be a silicon substrate, an silicon on insulator (SOI) substrate, or a gallium arsenide substrate. The substrate 12 can be undoped, lightly doped or heavily doped with dopants. In the embodiment, the substrate 12 includes a bulk portion that is advantageously a p-type monocrystalline silicon. The substrate 12 is cleaned to remove contaminants and then etched to form an array of three-dimensional islands 20. Each island 20, which is a part of the substrate 12, includes a top portion 24 and sidewall portions 22, and is spaced apart from adjacent islands 20 by a bottom surface 16 on the etched substrate 12. The opposing sidewall portions 22 of two adjacent islands 20 and the bottom surface therebetween together define a trench space 18. Since the process of the invention does not require any accurate mask work in defining a trench, the invention is generally immune to the mask misalignment and high aspect ratio limitations found in conventional techniques.

Next, the sidewall portions 22 and the bottom surface 16 are doped with N+ type dopants such as As by, for example, a drive-in process. The N+ doped region 32 corresponds to the first plate of the capacitor 30. The first plate 32 is coupled to the substrate reference voltage (not shown). Subsequent to the formation of the first plate 32, a dielectric layer 34 such as nitride oxide (NO) is deposited on the sidewall portions 22. A polysilicon layer 36 is then deposited on the dielectric layer 34. The polysilicon layer 36 corresponds to the second plate, or storage node, of the capacitor 30.

Figure 5B:
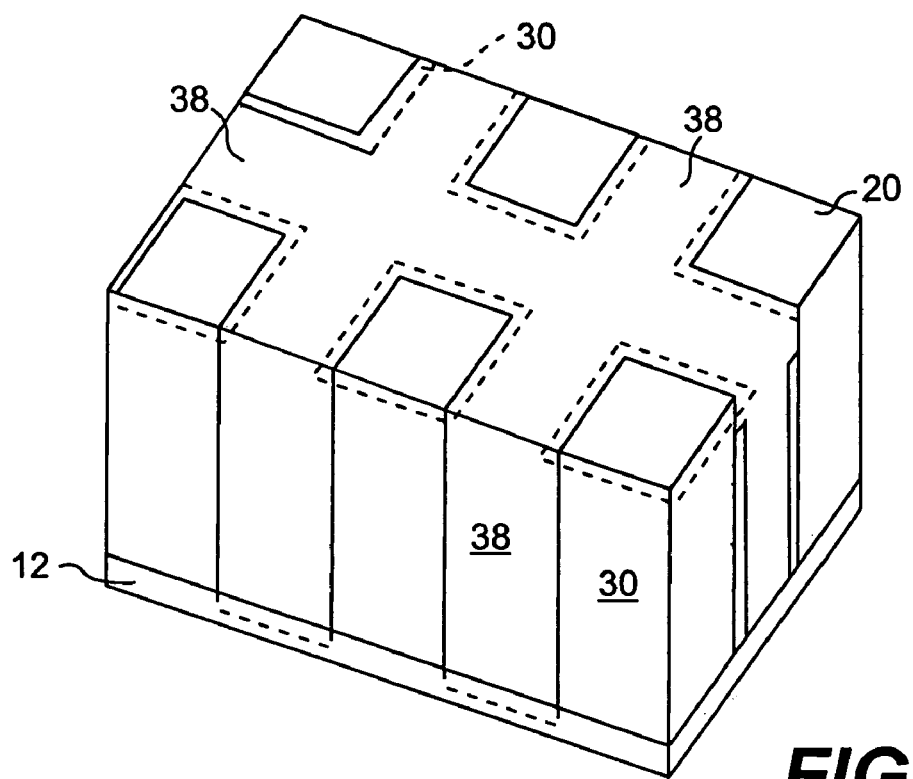

Referring to FIG. 5B, an insulating material 38 such as oxide is deposited on the bottom surface 16 to fill the spaces, including the defined trench spaces 18, among the islands 20. A chemical mechanical polarization (CMP) process is then performed to polish the layer of insulating material 38 down to the top surface of the islands 20. The insulating material 38 electrically isolates the cells.

Figure 5C:
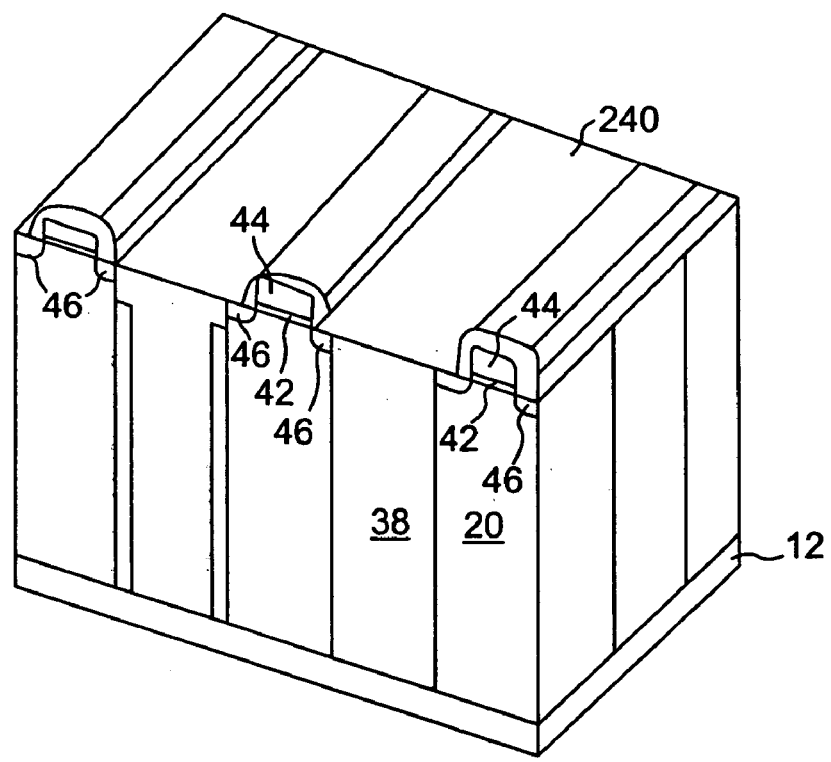

Referring now to FIG. 5C, gate oxide layers 42 and gates 44 are formed on a top surface 240 of the top portion 24 by conventional processes. The diffused regions 46 corresponding to the source/drain pair of the transistors 40 are then formed by ion implantation.

Figure 5D:
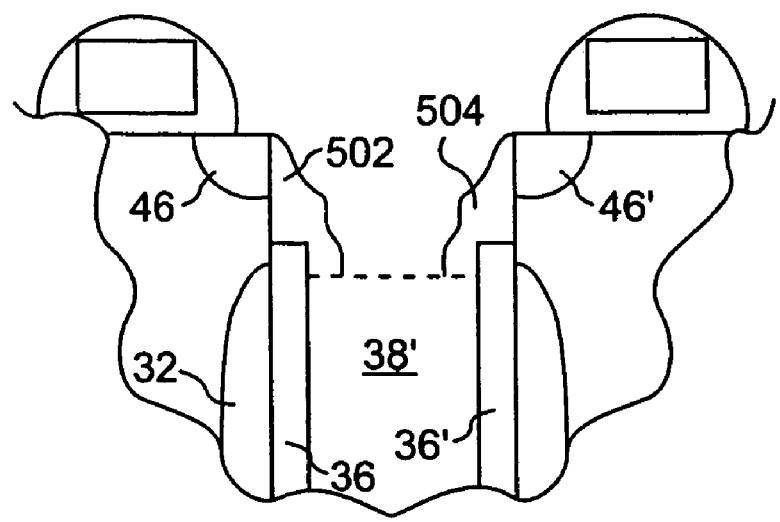

FIG. 5D shows the formation of a buried strap 50 to couple the polysilicon layer 36 of the capacitor 30 to one of the diffused region 46 of the transistor 40. The insulating material 38 disposed on every other bottom surface in the direction of a bit line is etched to expose the polysilicon layers 36 of two adjacent cells. A conductor layer is deposited on the etched insulating material 38'. The conductor layer is etched to form a first conductor portion 502 and a second conductor portion 504 spaced apart from the first conductor portion 502. The first conductor portion 502 couples the diffused region 46 of a cell to the polysilicon layer 36 of the cell, and the second conductor portion 504 couples the diffused region 46' of the adjacent cell to a polysilicon layer 36' of the adjacent cell.

Figure 5E:
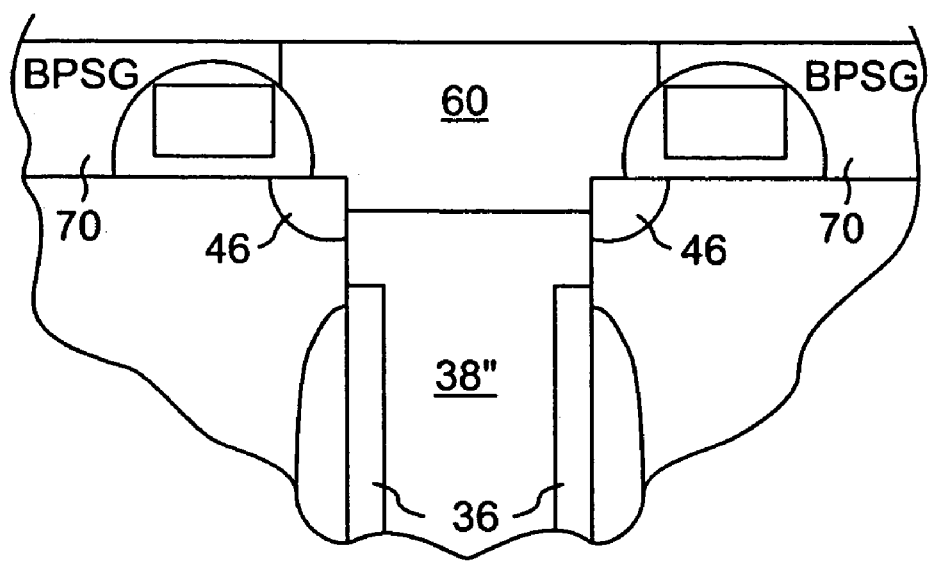

FIG. 5E shows the formation of a bit line contact layer 60 to couple the diffused regions to a bit line. The remaining insulating material 38 disposed on every other bottom surface in the direction of the bit line is etched to expose the remaining diffused regions 46. A contact layer 60 is then deposited on the etched remaining insulating material 38" to couple the diffused regions 46. A passivation layer 70 such as BPSG (borophosphosilicate glass) is then deposited to provide insulation and protection for the cells.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A memory cell, comprising:
    a semiconductor substrate, including an island formed from the substrate having a top portion and at least one sidewall portion;
    a capacitor formed contiguous with the sidewall portion; and
    a transistor formed on the top portion of the island, the transistor including a gate oxide layer formed on a surface of the top portion, a gate formed on the gate oxide layer, and a first and a second diffused regions formed in the top portion, the first diffused region being spaced apart from the second diffused region.

2. The memory cell of claim 1, wherein the first plate is doped silicon.

3. The memory cell of claim 1, wherein the second plate is a polysilicon layer.

4. The memory cell of claim 1, further comprising a collar oxide layer disposed on an upper sidewall portion and contiguous with the dielectric layer and the second plate.

5. The memory cell of claim 1, further comprising a buried strap to couple the first diffused region of the transistor to the second plate of the capacitor.

6. The memory cell of claim 5, further comprising a contact layer to couple the second diffused region of the transistor to a bit line.

7. The memory cell of claim 1, wherein the gate of the transistor is coupled to a word line.

8. A memory device, comprising:
    a semiconductor substrate; and
    an array of memory cells, each cell being electrically isolated from adjacent cells and including
        an island formed from the substrate having a top portion and at least one sidewall portion, and being spaced apart from other islands by a bottom surface on the substrate;
        a capacitor formed contiguous with the sidewall portion; and
        a transistor formed on the top portion of the island, the transistor including a gate oxide layer formed on a surface of the top portion, a gate formed on the gate oxide layer, and a first and a second diffused regions formed in the top portion, the first diffused region being spaced apart from the second diffused region.

9. The memory device of claim 8, wherein the first plate is doped silicon.

10. The memory device of claim 8, wherein the second plate is a polysilicon layer.

11. The memory device of claim 8, further comprising a collar oxide layer disposed on an upper sidewall portion and contiguous with the dielectric layer and the second plate.

12. The memory device of claim 8, each cell further comprising a buried strap to couple the first diffused region of the transistor to the second plate of the capacitor.

13. The memory device of claim 12, wherein the buried strap of a cell is spaced laterally from the buried strap of an adjacent cell.

* * * * *